United States Patent
Koch et al.

[19]

[11] Patent Number: 6,005,800
[45] Date of Patent: Dec. 21, 1999

[54] MAGNETIC MEMORY ARRAY WITH PAIRED ASYMMETRIC MEMORY CELLS FOR IMPROVED WRITE MARGIN

[75] Inventors: Roger Hilsen Koch, Amawalk, N.Y.; Roy Edwin Scheuerlein, Cupertino, Calif.

[73] Assignee: International Business Machines Corporation, Armonk, N.Y.

[21] Appl. No.: 09/198,185

[22] Filed: Nov. 23, 1998

[51] Int. Cl.⁶ ..................................................... G11C 11/15
[52] U.S. Cl. .............................. 365/173; 365/31; 365/33; 365/55
[58] Field of Search ........................ 428/692; 365/230.07, 365/171, 158, 55, 157, 164, 173, 66, 1, 31, 74, 97, 33, 32

[56] References Cited

U.S. PATENT DOCUMENTS

| | | | |
|---|---|---|---|
| 4,731,757 | 3/1988 | Daughton et al. | 365/173 |
| 5,251,170 | 10/1993 | Daughton et al. | 365/158 |
| 5,343,422 | 8/1994 | Kung et al. | 365/173 |
| 5,640,343 | 6/1997 | Gallagher et al. | 365/171 |
| 5,734,606 | 3/1998 | Tehrani et al. | 365/173 |
| 5,757,695 | 5/1998 | Shi et al. | 365/158 |
| 5,768,181 | 6/1998 | Zhu et al. | 365/158 |
| 5,792,569 | 8/1998 | Sun et al. | 428/692 |
| 5,793,693 | 8/1998 | Sheuerlein | 365/230.07 |
| 5,828,598 | 10/1998 | Chen et al. | 365/158 |

OTHER PUBLICATIONS

A.V.Pohm et al., "Experimental and Analytical Properties of 0.2 Micron Wide, Multi–Layer,GMR,Memory Elements" IEEE Transactions on Magnetics, vol. 32, No. 5, Sep. 1996, pp. 4645–4647.

Primary Examiner—David Nelms
Assistant Examiner—Thong Le
Attorney, Agent, or Firm—Thomas R. Berthold

[57] ABSTRACT

A nonvolatile magnetic memory array uses magnetic memory cells that are formed in two types of shapes. The cells lie at the intersections of rows and columns of electrically conductive lines, which serve as the conductive paths for the write currents used to change the magnetization states of the magnetic cells. The two types of cells have shapes that are mirror images of each other, i.e, the shape of the second type of cell is arrived at by rotating the first type of cell 180 degrees about an axis through the cell. The two types of cells are thus a pair of asymmetric cells because they are asymmetric in regard to the predominant axis of magnetization. In the preferred pattern, each of the cells has a parallelogram shape with a length and a width with the predominant axis of magnetization lying substantially along a line between the acute corners of the parallelogram. The two types of cells are preferably arranged in the array in an alternating checkerboard pattern, which means that one type of cell is surrounded by neighboring cells of the other type. Because the predominant axis of magnetization of all neighboring cells is different from the predominant axis of magnetization of the cell selected for writing, there is substantially less likelihood that adjacent neighboring cells will also be written to. The memory array may be formed using either magnetic tunnel junction (MTJ) cells or giant magnetoresistance (GMR) cells.

34 Claims, 12 Drawing Sheets

Section AA

MAGNETIC MEMORY ARRAY WITH PAIRED ASYMMETRIC MEMORY CELLS FOR IMPROVED WRITE MARGIN

STATEMENT OF GOVERNMENT RIGHTS

The Government of the United States of America has rights in this invention pursuant to Contract No. MDA972-96-C-0030 awarded by the Defense Advanced Research Projects Agency.

TECHNICAL FIELD

This invention relates generally to magnetic devices, and more particularly to nonvolatile magnetic random access memory (MRAM) devices formed from an array of giant magnetoresistance (GMR) or magnetic tunnel junction (MTJ) magnetic memory cells.

BACKGROUND OF THE INVENTION

A nonvolatile magnetic random access memory (MRAM) is an array of memory cells formed on intersections of word lines and sense lines, each memory cell typically having two magnetic layers separated by a conductive or insulating layer. IBM's U.S. Pat. No. 5,343,422 describes an MRAM array wherein the memory cells operate on the basis of giant magnetoresistance (GMR), where each cell is a "spin-valve" cell comprising two thin layers of ferromagnetic material separated by a thin layer of nonmagnetic metallic conducting material, such as copper. IBM's U.S. Pat. No. 5,640,343 describes an MRAM array formed from magnetic tunnel junction (MTJ) memory cells, where each cell comprises two thin layers of ferromagnetic material separated by a thin layer of insulating material, such as alumina. In the GMR type of MRAM array, the magnetization easy-axis of both ferromagnetic layers in each memory cell or storage element is oriented substantially lengthwise of the storage elements and substantially parallel to the direction of an applied sense current. In the MTJ type of MRAM array, the sense current is perpendicular to the plane of the magnetic layers. The magnetic moment or magnetization direction of one of the ferromagnetic layers is fixed in a direction substantially lengthwise of the storage elements, and the magnetization direction of the other layer is free to switch between two digital states in which the magnetization is substantially parallel or substantially antiparallel to the magnetization direction in the one layer.

To fabricate a large and reliably accessed MRAM array containing thousands or millions of cells on a single chip, uniformity and predictability of the magnetic response characteristic of each cell is of great importance. Prior methods of accessing unique cells for storing data involved two write currents, each producing less magnetic stimulus required to write a cell, but together producing more magnetic stimulus than required to write the cell. However, due to many factors related to manufacturing uncertainties and intrinsic magnetic material variability, cell to cell magnetic response variations can be very large. This magnetic response variability from cell to cell directly impacts the electrical and resultant magnetic writing stimulus needed to access each cell for storing data, and therefore prevents array-wide selectivity to occur using a preferred, fixed electrical and resultant magnetic writing stimulus value.

The prior art approach to the magnetic cell variability problem has been to improve the manufacturing process. This has been challenging because the magnetic response of the cells is sensitive not only to local defects but also to edge and surface roughness.

What is needed is an MRAM array that is operable even when there is variability of magnetic properties among the cells.

SUMMARY OF THE INVENTION

The invention is a nonvolatile magnetic memory array having two types of magnetic memory cells. The cells lie at the intersections of rows and columns of electrically conductive lines, which serve as the conductive paths for the write currents used to change the magnetization states of the magnetic cells. The two types of cells have shapes that are mirror images of each other, i.e, the shape of the second type of cell is arrived at by rotating the first type of cell 180 degrees about an axis through the cell. The two types of cells are thus a pair of asymmetric cells because they are asymmetric in regard to the predominant axis of magnetization. In the preferred pattern, each of the cells has a parallelogram shape with a length and a width with the predominant axis of magnetization lying substantially along a line between the acute corners of the parallelogram. The two types of cells are preferably arranged in the array in an alternating checkerboard pattern, which means that one type of cell is surrounded by neighboring cells of the other type. Because the predominant axis of magnetization of all neighboring cells is different from the predominant axis of magnetization of the cell selected for writing, an increased write margin is provided. As a result, when write currents are directed through a selected row and column to write or change the magnetization state of the cell at the intersection of the selected row and column, there is substantially less likelihood that adjacent neighboring cells will also be written to.

For a fuller understanding of the nature and advantages of the present invention, reference should be made to the following detailed description taken together with the accompanying figures.

DETAILED DESCRIPTION OF THE PREFERRED EMBODIMENTS

Prior Art MTJ Array

Figure 1A:
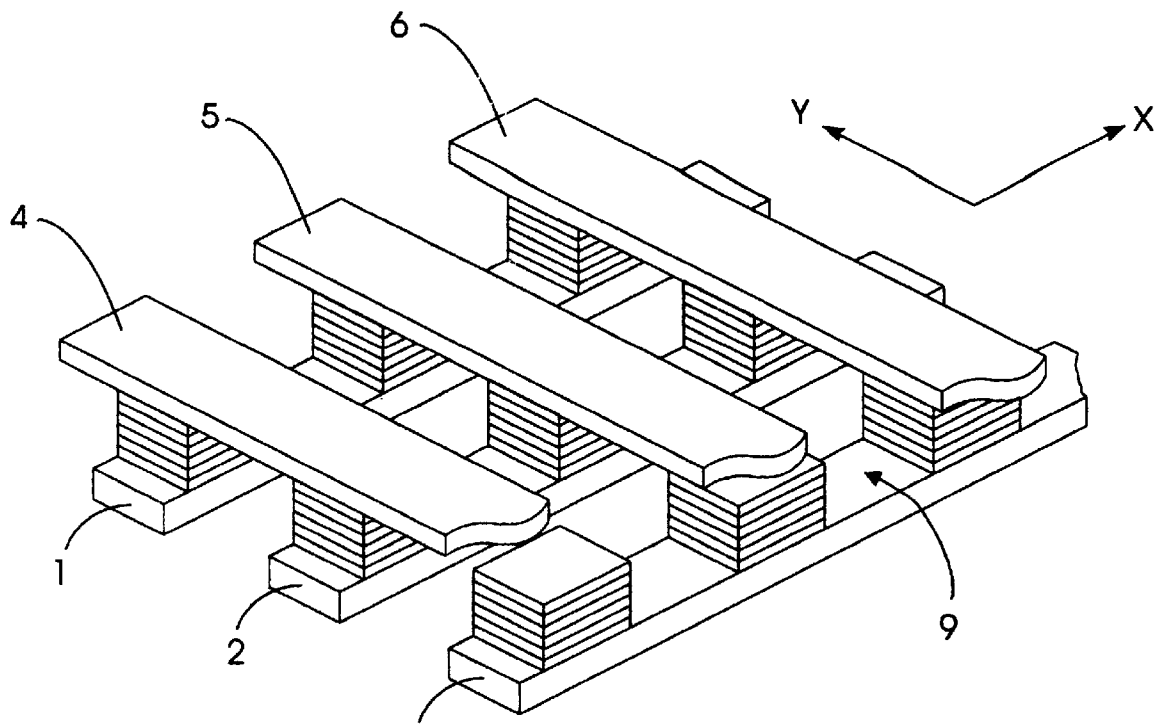
FIG. 1A depicts a prior art MTJ type of MRAM array having magnetic memory cells disposed at the intersecting regions of crossing sense lines and word lines.
Figure 1B:
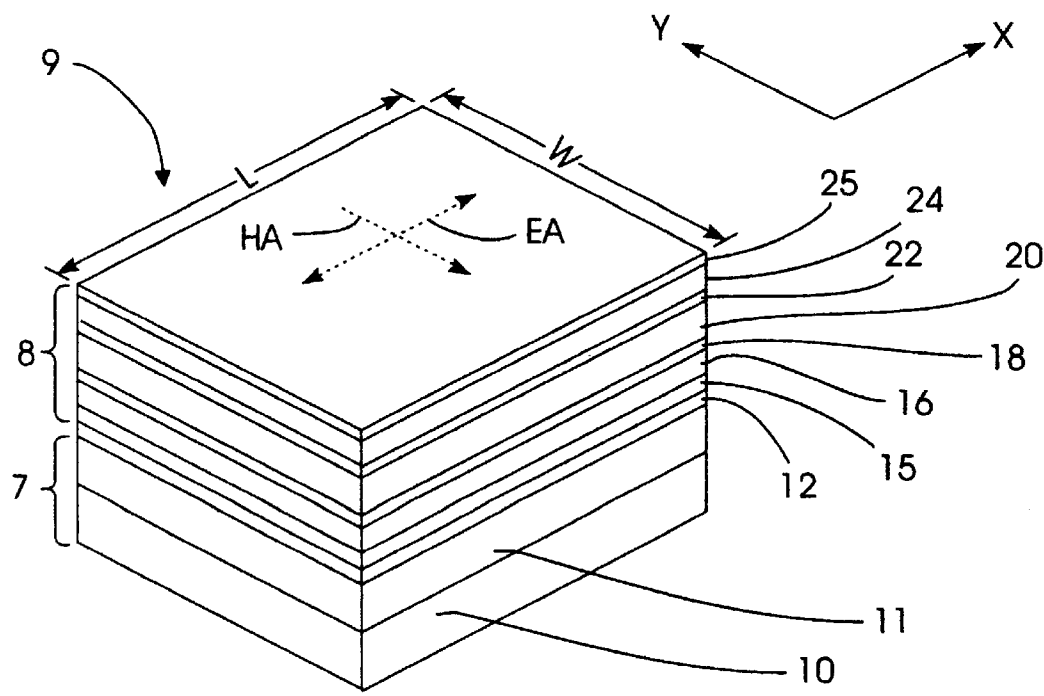
FIG. 1B depicts exemplary layers forming a single one of the magnetic memory cells of FIG. 1A.

An example of an MTJ MRAM array is shown in FIG. 1A, wherein the MTJ cells are positioned at the intersections of an exemplary rectangular grid of electrically conductive lines 1–6. The MRAM array includes a set of electrically conductive lines that function as parallel word lines 1, 2, and 3 in a horizontal plane, and a set of electrically conductive lines that function as parallel bit or sense lines 4, 5, and 6 in another horizontal plane. The sense lines are oriented in a different direction, e.g., at right angles to the word lines, so that the two sets of lines intersect when viewed from above. A memory cell, such as typical memory cell 9 shown in detail in FIG. 1B, is located at each crossing point of the word lines and sense lines in the intersection region vertically spaced between the lines. Three word lines and three sense lines are illustrated in FIG. 1A, but the number of lines would typically be much larger. The memory cell 9 is arranged in a vertical stack and may include a diode 7 in addition to the magnetic tunnel junction (MTJ) 8. During a sensing or reading operation of the array, current flows in a vertical direction through the cell 9. The vertical current path through the memory cell permits the memory cell to occupy a very small surface area. Contact to the word lines, the MTJ, the diode, and the contact to the bit line all occupy the same area. While not shown in FIG. 1A, the array may be formed on a substrate, such as a silicon substrate which contains other circuitry. Also, a layer of insulating material is usually located between the bit lines and word lines at regions of the MRAM other than the intersecting regions.

The structure of the memory cell 9 is described in more detail with reference to FIG. 1B. The memory cell 9 is formed on and in contact with a word line 3 (FIG. 1A). The memory cell 9 comprises a vertical stack of a diode-like device, e.g., silicon junction diode 7, and an MTJ 8 in electrical series connection. The diode 7 is a silicon junction diode that comprises an n-type silicon layer 10 and a p-type silicon layer 11. The diode's p-type silicon layer 11 is connected to the MTJ 8 via a ohmic contact layer 12 which would include a barrier layer such as titanium nitride, It is beneficial for the contact layer 12 and the diode 7 to be thin to reduce spacing between the word line and MTJ. The diode's n-type silicon layer 10 is connected to word line 3.

The MTJ 8 is formed of a series of layers of material stacked one on top of the other. The MTJ 8 of FIG. 1B comprises a template layer 15, such as Pt, Pd or Ti, an initial ferromagnetic layer 16, such as permalloy (Ni-Fe), an antiferromagnetic layer (AF) 18, such as Mn-Fe, a fixed or "pinned" type of reference ferromagnetic layer 20, such as Co, Fe or permalloy, a thin insulating tunnel barrier layer 22 of alumina ($Al_2O_3$), a soft, changeable "free" ferromagnetic layer 24, such as a sandwich of thin Co-Fe with permalloy, and a contact layer 25, such as Pt, Pd or Ti.

The free layer 24 is fabricated to have a preferred axis for the direction of magnetization called the easy-axis (EA). There are two possible directions of magnetization of the free layer 24 along this easy-axis which define the two states of the memory cell. In contrast, the reference layer 20 may be fabricated to have only one preferred direction of magnetization, called its unidirectional anisotropy direction, and this direction is parallel to the easy-axis of the free layer. The desired easy-axis for the free layer is set by some combination of intrinsic anisotropy, strain-induced anisotropy and shape anisotropy of the MTJ. The MTJ and free layer depicted may be made in the shape of a rectangle of length L and width W, where L is larger than W (FIG. 1B). The magnetic moment of the free layer prefers to align along the direction of L.

As shown in FIG. 1A, the electrically conductive lines 1, 2, 3 and 4, 5, 6 are arranged in rows and columns, respectively, that cross, thereby forming intersecting regions at which the cells are positioned. As discussed above, each cell comprises a free ferromagnetic layer 24 and a fixed or reference ferromagnetic layer 20. (The term reference layer is used broadly herein to denote any type of ferromagnetic region which, in cooperation with the free or changeable region, results in a detectable state of the device as a whole.) The ability of this type of cell to store electrically accessible data hinges on electron tunneling between these two ferromagnetic layers, which in turn is dependent on the relative directions of magnetization of the two ferromagnetic layers. Rotating the magnetization in the free layer into one of two selectable directions in a bi-stable manner results in binary state stored in the cell. If the cell is oriented with its magnetic easy-axis (EA) along the X-axis then an electrical writing current flowing through line 5 (perpendicular to the X-axis) will apply an EA magnetic field to the cell, and a current flowing through line 3 (perpendicular to the Y-axis) will apply a hard-axis (HA) magnetic field to the cell.

Figure 2A:
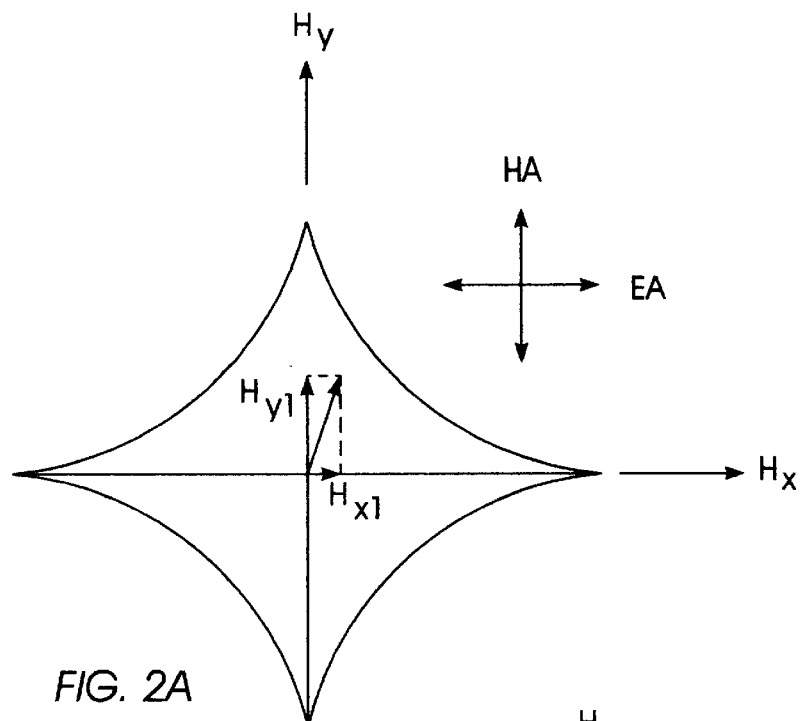
FIG. 2A is an "asteroid" model of the magnetic response of an ideal single domain magnetic region used to model the generally rectangularly shaped magnetic tunnel junction cell.

In one implementation of MRAM cells, the writing of individual cells adheres to a concept referred to as the "asteroid" for switching. The switching threshold of a single free layer in a cell depends on the combination of EA and HA magnetic fields applied by the write currents. This "Stoner-Wohifarth" asteroid model, shown in FIG. 2A, illustrates these threshold values in the plane of applied EA and HA fields. Switching of the magnetization direction of the free layer from parallel to antiparallel to the magnetization direction of the fixed or reference layer, or vice versa, occurs when a combination of EA and HA fields at the cell results in a vector outside of the asteroid. Selectively switching a single cell within the array is achieved by applying electrical currents through a selected pair of conductors along the X and Y axes. These currents generate a combination of EA and HA fields only at the cell located at the intersection of these lines, theoretically switching the selected cell, but not the neighboring cells. All the cells in a row parallel to the X-axis will experience the same applied HA field. Similarly all the cells in a column parallel to the Y-axis will experience the same applied EA field. However, only the cell at the intersection of these lines will experience the combination of both fields necessary for switching. Vectors representing applied magnetic fields that lie inside the asteroid will not switch the cell from one of its current bi-stable states. Thus, in FIG. 2A for example, if write currents through the conductors in the −X and −Y directions generate magnetic field components with values of $H_{Y1}$ and $H_{X1}$, respectively, the resulting magnetic field vector will be inside the asteroid and the magnetization direction of the free layer will not switch.

Figure 2B:
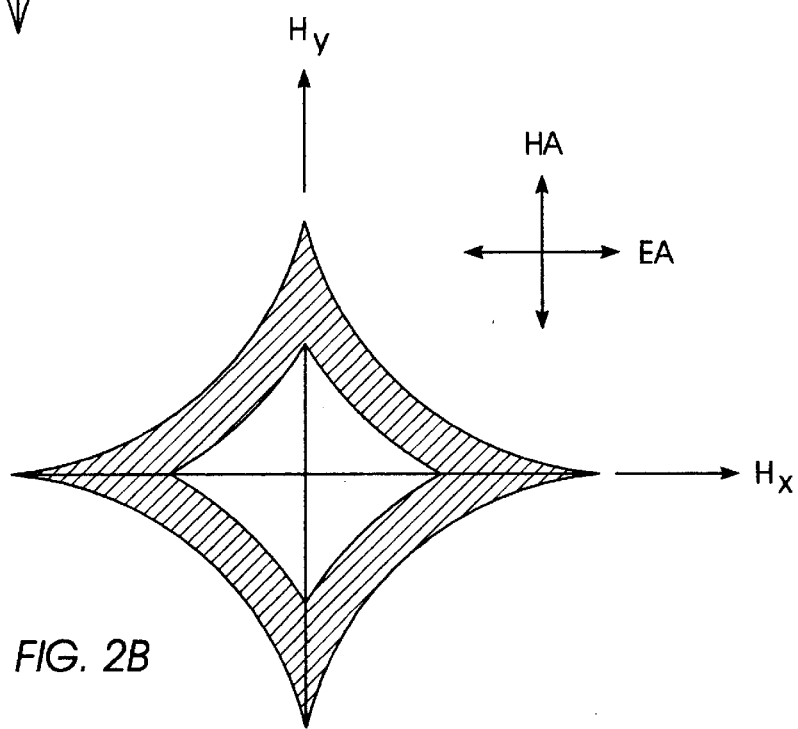
FIG. 2B is an asteroid model of the ranges of magnetic responses of single magnetic tunnel junction cells, each cell having an unpredictable response, and illustrates the narrowing of the margin of write current needed to write one cell without writing an adjacent cell.

Problems arise when the thresholds of the asteroid vary from cell to cell, and from hysteresis loop to hysteresis loop in the same cell. This variability in the magnetic properties from cell to cell leads to a broadening of the asteroid into a band of threshold values, as shown in FIG. 2B. Since the ability to selectively switch cells hinges on all cells except one along a line not being switched under a single applied HA or EA field, if this band of the asteroid broadens too much, then it is no longer possible to selectively write individual cells with consistent values of write current, since other non-selected cells along the lines may also switch.

Prior Art GMR Array

Figure 3A:
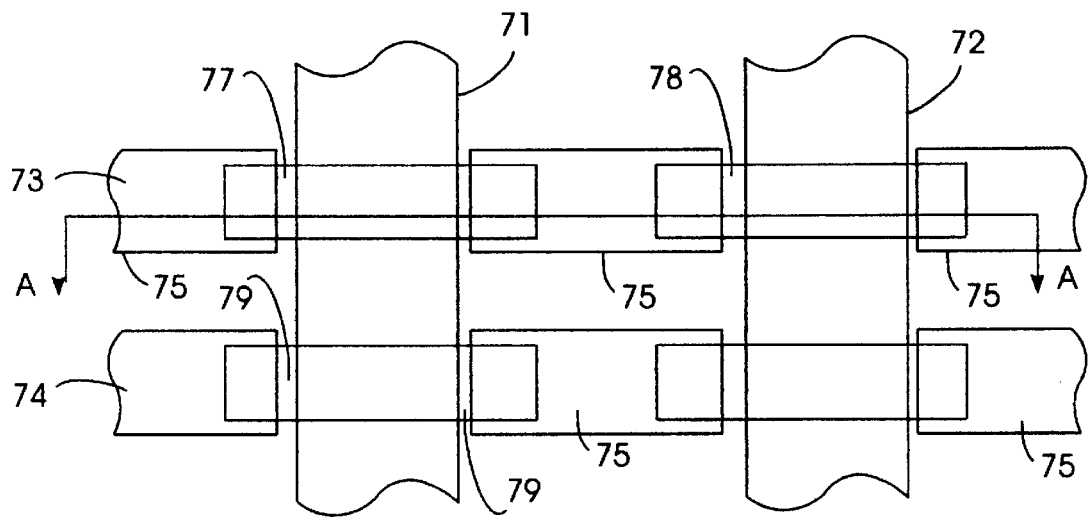
FIGS. 3A and 3B depict top and side views, respectively, of a prior art GMR type of MRAM array having magnetic memory cells disposed at the intersecting regions of crossing sense lines and word lines.
Figure 3B:
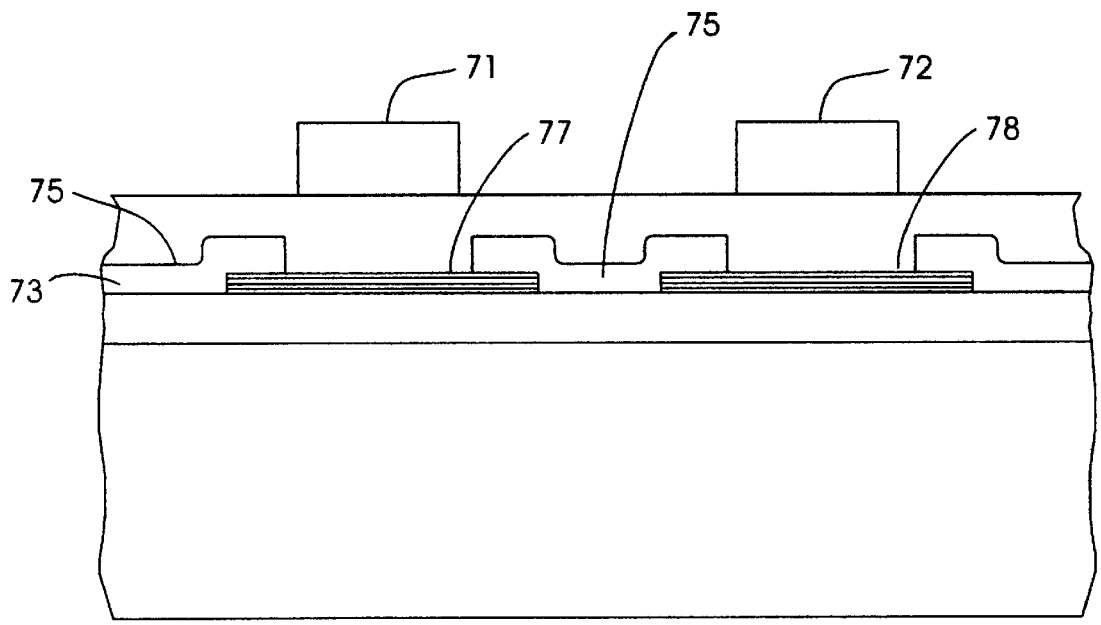

GMR elements have at least one fixed ferromagnetic layer and at least one free ferromagnetic layer, which is used to store data by its direction of magnetization, arranged in a sandwich structure with intervening thin copper layers. In a GMR type MRAM a write conductor generally perpendicular to the easy-axis of the GMR element passes over each GMR element. The sense line itself is used as a second write conductor. A GMR type of MRAM, shown in plan and cross section views in FIGS. 3A–3B, includes write conductors 71, 72 and sense lines 73, 74. The sense lines include GMR spin valve elements (such as elements 77, 78 in line 73) that are connected in series by low resistance metal stitch regions 75. The GMR elements include a fixed ferromagnetic layer and a free ferromagnetic layer. To write the GMR MRAM cell 77 a write current less than that required to flip the direction of magnetization of the free layer is passed through the write conductor 71, and a second write current is passed through the sense line 73. The combination of fields produced by the two write currents has to be sufficient to flip the direction of magnetization of the free layer of cell 77 but not so large that if flips the direction of magnetization of neighboring cells, such as cells 78 and 79. Variability in manufacturing and material properties make this difficult to achieve for arrays of many cells packed closely together in the same way it does for the MTJ array described above.

DESCRIPTION OF THE PREFERRED EMBODIMENTS

Figure 4:
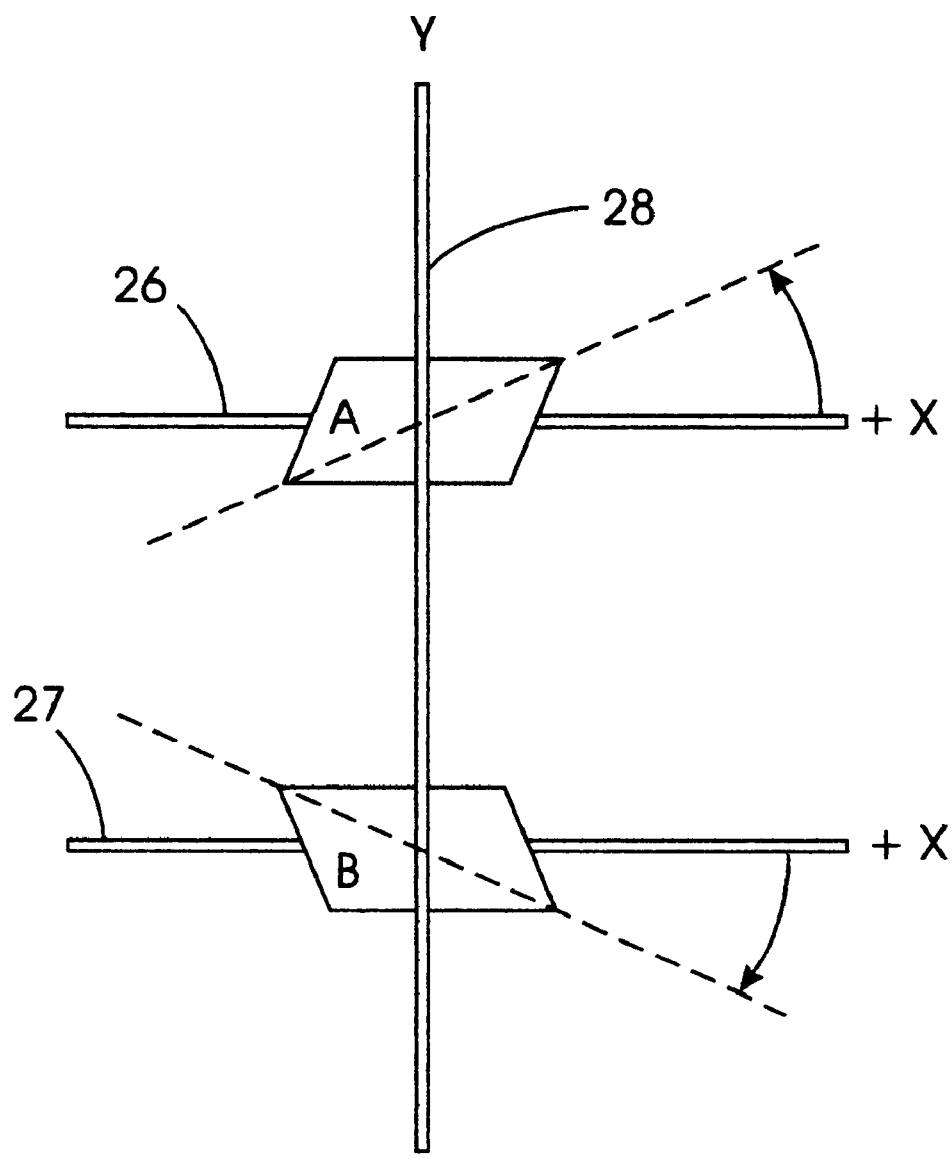
FIG. 4 depicts a pair of asymmetric parallelogram-shaped magnetic cells of the present invention.

The invention is a pair of asymmetric magnetic memory cells, denoted as A and B cells in FIG. 4, each with a magnetic layer with a predominant axis of magnetization for storing data states, where the predominant axes of magnetization (shown by the dashed lines) of the two cells are not parallel. Preferably the predominant axis of one of the pair, e.g., A, is rotated counter clockwise from the conductor 26 which carries a write current, and the predominant axis of the other of the pair, e.g., B, is rotated an equal amount clockwise from the conductor 27.

Referring to FIG. 4, the cells share a first write conductor 28 which lies along the Y-axis of a presumed X-Y coordinate system for the plan view of the cells. For clarity of the explanation, the case of the first write conductor 28 being above the magnetic element and the other write conductors 26, 27 being below the magnetic element is described in detail. Write circuitry is connected to the write lines to enable write currents to be directed in either direction along their lengths. Because the first write conductor is assumed to lie above the magnetic elements, write current in the +Y direction will generate magnetic fields in the −X direction. The cells of the pair have separate write conductors 26, 27 of a second type which run perpendicular to the first write conductor 28 and are below the magnetic elements. Because write conductors 26, 27 are below the magnetic elements, write currents in the +X direction will generate magnetic fields in the −Y direction. Note that all the write conductors could be above the magnetic element or below it. The same benefit of improved write selectivity occurs by adjusting the polarity of the current in the conductor that has a changed relative location to the magnetic element. The write conductors are separated from each other by insulating material. The rotation of magnetization direction is preferably created by a difference in shape between A and B. Various shapes will produce a rotation of magnetization direction away from the X or Y axes. Parallelograms, rectangles not aligned with the axes, trapezoids, truncated parallelograms and others are discussed below. A simple way to produce a pair of cells which have magnetization directions rotated away from the X or Y axes, one clockwise and one counter clockwise, but which are equal in magnitude, is to rotate the shape about the X or Y axes 180 degrees. Because of the bidirectional symmetry of the two magnetic states of a magnetic element along the magnetization direction, rotation by 180 degrees about the X or Y axes produces a similar result.

Figure 5A:
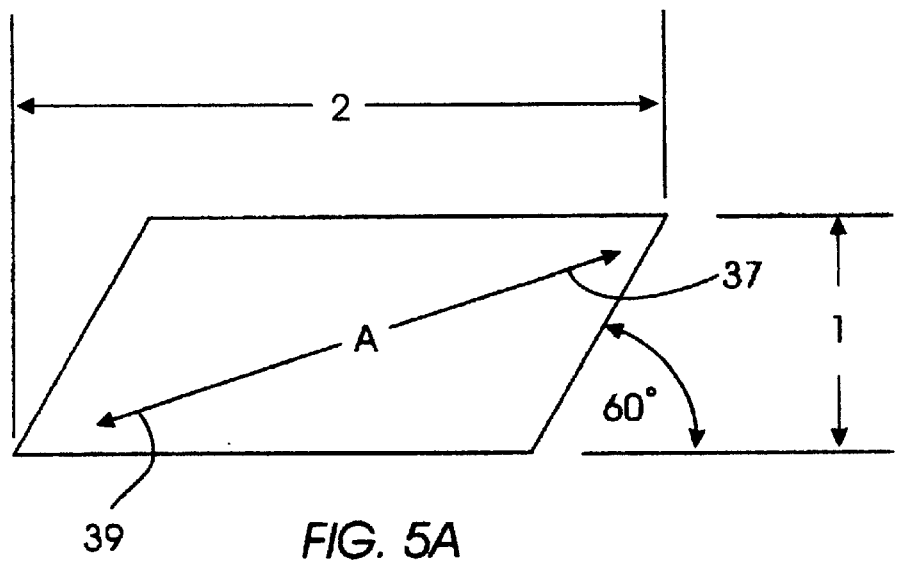
FIG. 5A depicts a parallelogram shaped cell showing the two free layer antiparallel magnetization directions.
Figure 5B:
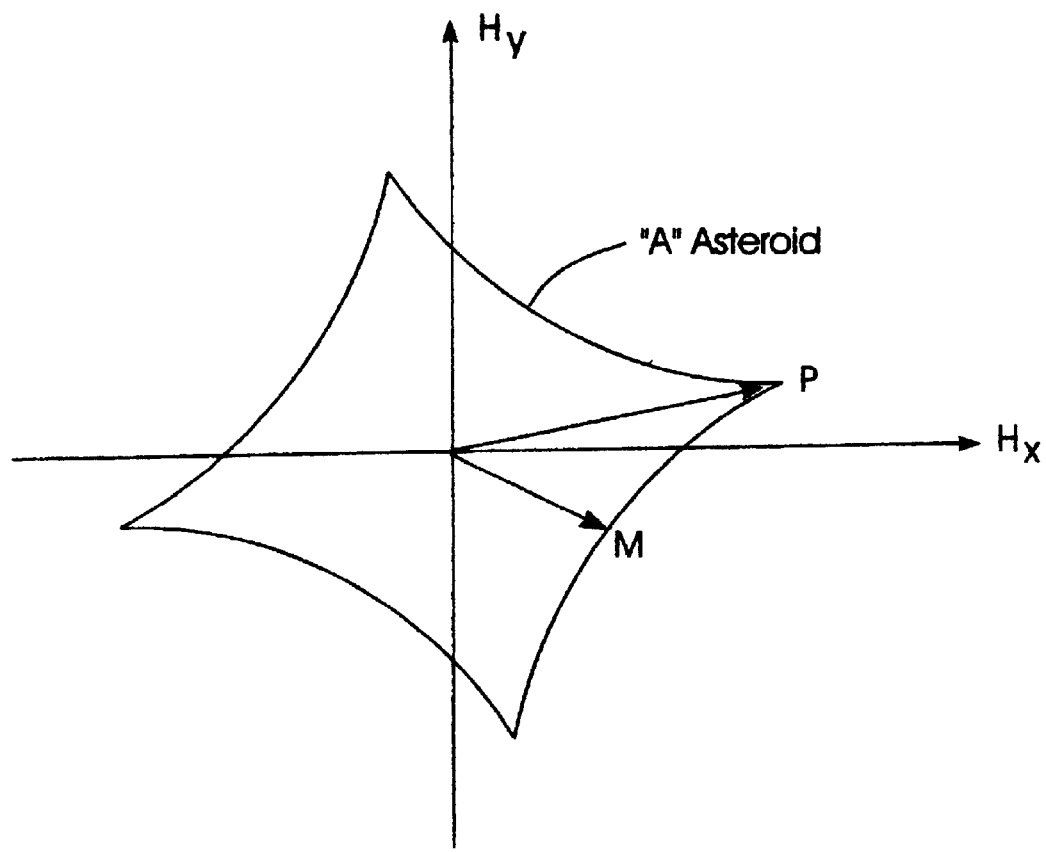
FIG. 5B depicts the asteroid curve of the magnetic response of the parallelogram cell of FIG. 5A.

The explanation of the write selectivity improvement for an asymmetric pair of cells A and B will be described for a parallelogram and its rotation about the X-axis. However, any pair of shapes which produce a similar asymmetry in direction of magnetization will achieve a similar benefit. FIG. 5A shows the magnetization directions (arrows 37, 39) of the two stable magnetic states of the free ferromagnetic layer in the A type of cell, for a 60-degree parallelogram with a length-to-width ratio of 2:1. FIG. 5B shows the asteroid curve corresponding to cell A. The asymmetry of the asteroid curve in FIG. 5B, i.e., the switching asymmetry of the parallelogram shaped cell, is due to the fact that the stable magnetization states are not aligned along the X-axis but are off-axis (by approximately 20 degrees for the 2:1 60-degree parallelogram). This shape of the A cell asteroid curve can be understood by first considering the case of a rectangular cell with its length along the X axis. The stable magnetization state is along the X-axis due to shape anisotropy, i.e., the minimum magnetostatic energy state is when the magnetic poles are the farthest away from each other. It is well known and described by the Steiner-Wolfarth asteroid curve that for the rectangular cell a larger field is required to switch the state when the field is applied along the X-axis than when the angle of applied field is about 45 degrees to the X-axis. This is because it is easier to rotate the magnetic domains than to directly oppose the magnetic moment. Directly opposing the moment reduces the net magnetization to zero by forcing a random orientation on the individual magnetic domains. On the other hand, rotation allows the individual magnetic domains to stay aligned, which is the energetically favorable state. Therefore the magnitude of the applied field required to flip the state is greater when the applied field direction is toward the point of the asteroid curve, which is the direction of the stable magnetization state. The same effect occurs when the parallelogram cell is considered, but the applied field is rotated off the X-axis. As shown in FIG. 5A, the magnetization directions are rotated about 20 degrees by the shape of the parallelogram. The minimum magnetostatic energy is when the poles are in opposite acute angle corners, as shown by the arrows 37, 39 in FIG. 5A. The applied magnetic field vector that ends at point P of the asteroid in FIG. 5B is the highest applied field to switch, which is at an angle of about 20 degrees from the X axis. Therefore, combining a positive $H_X$ field with a positive $H_Y$ field gives a total applied field vector directed toward the point P of the asteroid. But if $H_Y$ is negative, the applied field vector is in the direction of the midpoint M of the curved side of the asteroid and only about 50–70 percent as much total field is required to switch the magnetization direction.

Figure 6:
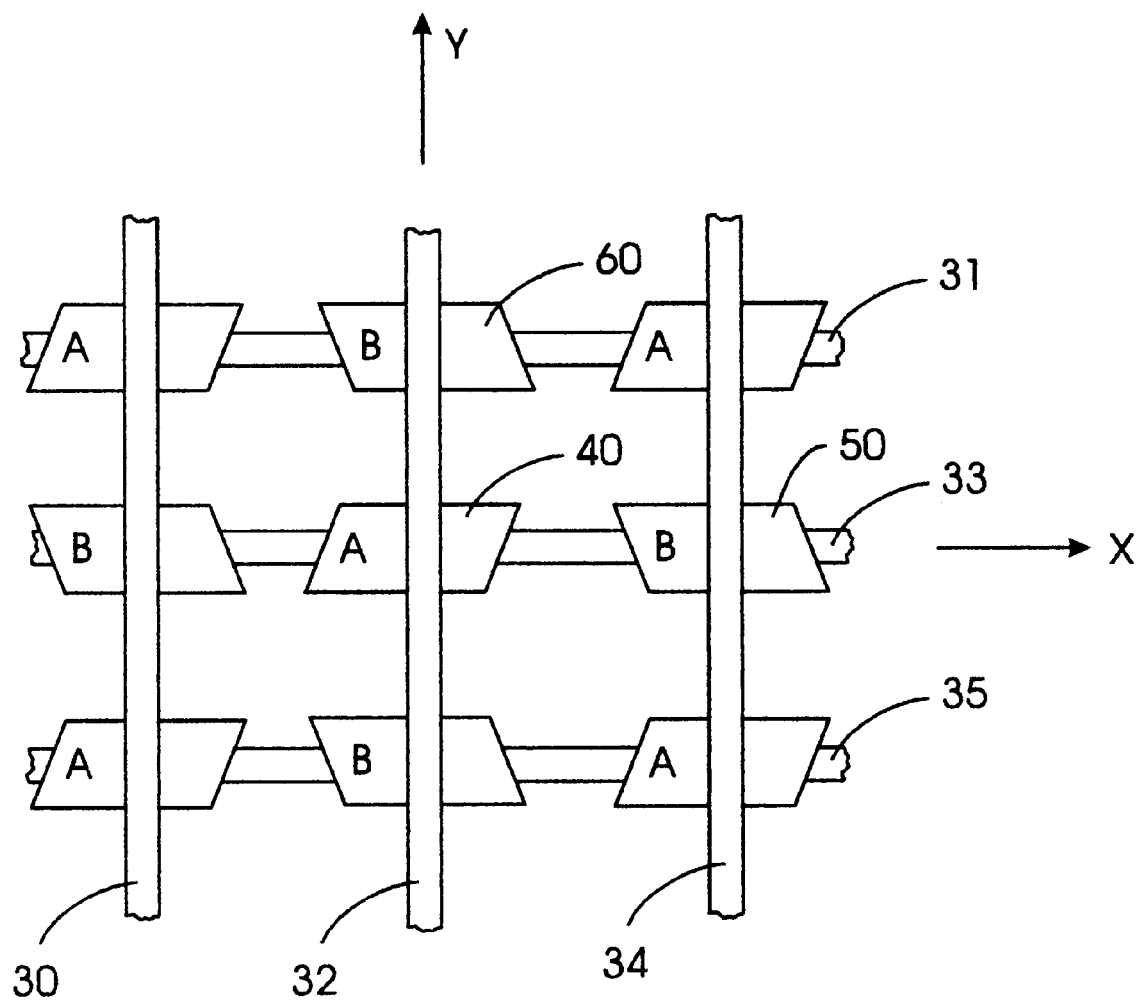
FIG. 6 depicts the MRAM array of the present invention illustrating a pattern of two types of parallelogram-shaped asymmetric cells arranged in a checkerboard pattern.
Figure 7:
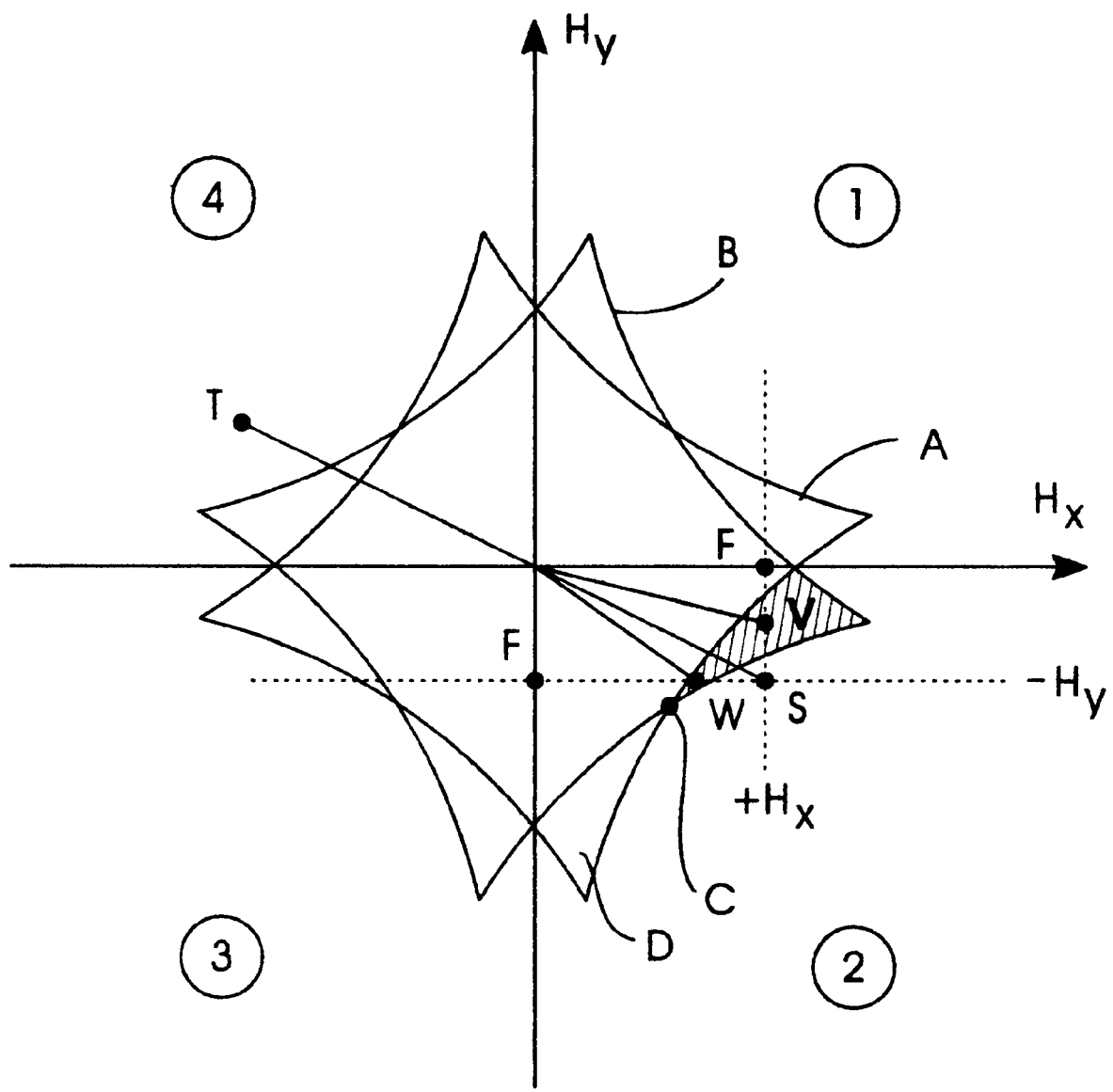
FIG. 7 depicts the asteroid curves of the magnetic responses of the two parallelogram-shaped asymmetric cells of FIG. 5A which are used in the MRAM array of FIG. 6.

FIG. 6 depicts an MRAM array with the two A and B types of parallelogram cells arranged in an alternating checkerboard pattern. FIG. 7 shows overlapping asteroid curves for A and B cells of FIG. 6, which are 3:1 length/width ratio 60-degree parallelogram cells, and the write margin provided by the paired asymmetric cells.

Referring to FIG. 6, one embodiment of the present invention is a MRAM array wherein the two different shapes of memory cells of the asymmetric pair (denoted as A and B types of cell shapes in FIG. 6) are formed on the substrate in a checkerboard pattern. The pattern is a "checkerboard" because the two types of cell shapes alternate, like the black and white squares of a checkerboard, so that all the nearest neighbor cells of a particular cell are of the different type. Preferably the two types of cells differ by the shape of the magnetic layer, which are mirror images of one another, i.e., rotation of one type of shape 180 degrees about an axis through the cell results in the other type of shape. The two types of cells can thus be referred to as paired asymmetric cells because they are asymmetric in regard to the predominant axis of magnetization, i.e., the predominant axis of magnetization is not parallel to either the X or Y axes. In the preferred pattern, each of the cells has a parallelogram shape with a length and a width. Electrically conductive write lines 31, 33, 35 are parallel to the X axis and located below the rows cells, and electrically conductive write lines 30, 32, 34 are arranged parallel to the Y axis and located above the columns of cells. Write circuitry is connected to the write lines to enable write current to be directed in either direction through the rows and columns of write lines to enable writing to the individual cells. Because write lines 31, 33, 35 are located below the magnetic elements, write current in the +X direction will generate magnetic fields in the −Y direction. Similarly, because write lines 30, 32, 34 are located above the magnetic elements, write current in the +Y direction will generate magnetic fields in the −X direction.

Referring to FIG. 7, assume an A type cell (cell 40 in FIG. 6) is selected for writing by application of an applied field vector that is directed to point S. The field vector to point S is the vector sum of a +$H_X$ component caused by write current in the −Y direction through line 32 (FIG. 6) and a −$H_Y$ component caused by write current in the +X direction through line 33 (FIG. 6). The vector to point S is outside the A asteroid curve so the magnetization direction of the free layer in the A cell will be rotated 180 degrees and the A cell will change its magnetic state. The direction and magnitude of the applied field vector S is selected by selection of the appropriate values of write currents through the write lines, e.g., lines 33 and 32 in the case of cell 40.

The nearest neighbor cell along the Y-axis in the array (cell 60 in FIG. 6) would also experience the +$H_X$ magnetic field component because it has write current passing through it only in the −Y direction (through line 32). However, cell 60 will experience a much lesser value of the −$H_Y$ magnetic field component because it is merely adjacent to write line 33. The vector to point V represents the magnetic field on cell 60 due to the writing to selected cell 40. As shown, point V is within the B cell asteroid curve and cell 60 will hold its state and will not be switched. However, as can be seen in FIG. 6, if cell 60 were also an A cell, as in the prior art where all cells have the same shape, its magnetic state would be switched. This is because point V lies outside the A cell asteroid curve.

The nearest neighbor cell along the X-axis in the array (cell 50 in FIG. 6) would also experience the same −$H_Y$ magnetic field component because it has write current passing through it only in the +X direction (through line 33). However, cell 50 will experience a much lesser value of the +$H_X$ magnetic field component because it is merely adjacent to write line 32. The vector to point W represents the magnetic field on cell 50 due to the writing to selected cell 40. Point W lies inside the B cell asteroid curve and cell 50 will not be switched. However, If cell 50 were also an A cell, it would fail to hold its state and would also be switched. This is because point W lies outside the A cell asteroid curve.

The magnetic fields experienced by cells far from the selected cell 40, but sharing an X or Y line, are shown by points F in FIG. 7. The rotation of the asteroids in FIG. 7 can reduce the safety margin F for a cell, i.e., how far inside the curve points F are located, so rotation of the magnetization should not be larger than about 30 degrees to ensure that cells are not disturbed while writing the selected cell. Therefore, the rotation of magnetization is preferably between 5 degrees and 30 degrees and most preferably about 15 degrees.

The additional write margin provided by the use of asymmetric cells in a checkerboard pattern is shown by the cross-hatched area in quadrant 2 of FIG. 7. Assume that for cells 40, 50 the initial magnetization direction of the free layer in each cell is primarily in the −X direction, i.e., toward the left acute corners of the A and B parallelograms. Point S in quadrant 2 of FIG. 7 represents the vector sum of the fields $H_X$ and $H_Y$ generated by write currents through lines 32 and 33, respectively. The write current through line 32 is in the −Y direction and the write current through line 33 is in the +X direction. Point S is outside the A asteroid curve so the magnetization direction of the free layer in cell 40 will be flipped to be generally in the +X direction (toward the right acute angle of the cell). However, because the adjacent B cell 50 has the mirror image shape of A cell 40, its asteroid curve is the mirror image of the A cell asteroid curve about the Y-axis. In quadrant 2 the B cell asteroid curve lies outside the A cell asteroid curve in the region where the applied magnetic field vector is designed to lie. In contrast, if cell 50 had the same shape as cell 40, as in the prior art, its asteroid curve would have the same shape as the asteroid curve of cell 40 but would likely be larger or smaller, due to the variation in properties of the cells, as shown by the prior art in FIG. 2B. While the −$H_Y$ field component from the write current in line 33 would be the same in this cell 50, the $H_X$ field component from the write current in line 32 would be less because cell 50 lies on line 34 adjacent to line 32. However, due to the variability in the cells, the precise location of the asteroid curves in quadrant 2 can not be predicted, and thus the write margin, i.e., the separation of the two asteroid curves in quadrant 2 for adjacent cells, can not be accurately predicted. However, with the present invention, the shape of the asteroid curve for cell 50 is also altered, as shown in FIG. 7, so that even if the asteroid curve of cell 50 is smaller, or the asteroid curve of cell 40 is larger, due to variations from cell to cell, the mere difference in asteroid shapes provides a write margin, as shown by the cross-hatched portion of quadrant 2 in FIG. 7.

As the cells are packed closer, i. e., the size of the cells are kept the same but the space decreases, the points V and W move closer to S and the benefit of the asymmetric asteroid curves caused by the paired asymmetric cells becomes increasingly important. The V and W points move closer to S because the distance to adjacent cells decreases so the field strength at those neighbors increases to a larger fraction of the field at the selected cell.

If the magnetization direction of the free layer of cell 40 were generally in the +X direction, then writing to the cell would occur in quadrant 4, i.e., the write currents in lines 33 and 32 would be in the −X and +Y directions, respectively. Thus all A cells are switched from "1" to "0" states, or vice versa, by switching the write currents through the A cells from +X (negative $H_Y$ field) and −Y (positive $H_X$ field) in quadrant 2 to −X (positive $H_Y$ field) and +Y (negative $H_X$ field) in quadrant 4, or vice versa. Writing to A cells in quadrant 4 is accomplished by merely reversing the write currents, but keeping the values of write currents the same. This is shown by the applied field vector to point T in FIG. 7. Thus the use of the paired asymmetric cells in the checkerboard pattern according to the present invention allows for fixed values of write current to be used, while also providing the improved write margin as described above. Similarly, as shown in quadrants 1 and 3 of FIG. 7, all B cells are switched from "1" to "0" states, or vice versa, by switching the write currents through the B cells from both positive directions to both negative directions, or vice versa. The increased write margin is available in all four quadrants.

In FIG. 7 the magnitude of $H_X$ is larger than the magnitude of $H_Y$ so point S lies closer to the easy axis (X) than the hard axis (Y) of the write fields. This is often the case in GMR and MTJ MRAM arrays because one conductor is usually in contact with the device and therefor currents through that conductor produce high magnetic fields at the magnetic element which is in close proximity. The second conductor is usually insulated from the device and therefore further away and therefore produces smaller fields for similar write current levels.

In FIG. 7 when point S is closer to the X-axis than the Y-axis, the alternating checkerboard pattern provides increased write margins, as indicated by the cross-hatched area. The cross-hatched area is where curve B is outside curve A (and note that the $H_X$ component of the write field is greater than the $H_Y$ component). Since curve B is outside, and neighbor cell 50 (FIG. 6) is type B, the neighbor cell 50 has a higher write field threshold, as desired for higher write margin. Next, consider a different situation where $H_X$ is less than $H_Y$. Since curve B and A cross at a point C (approximately equidistant from the X and Y axes), curve B is not outside curve A when $H_X$ is less than $H_Y$, as at area D in FIG. 7. It the write field vector for neighbor cell 50 of type B pointed to a point in area D, cell 50 would not have a higher field threshold as desired. Therefore if the $H_X$ and $H_Y$ magnitudes are nearly equal, or the $H_Y$ field magnitude is larger than the $H_X$ field for writing a cell, a different pattern of asymmetric cells is preferable. This type of pattern is shown in FIG. 8.

Figure 8:
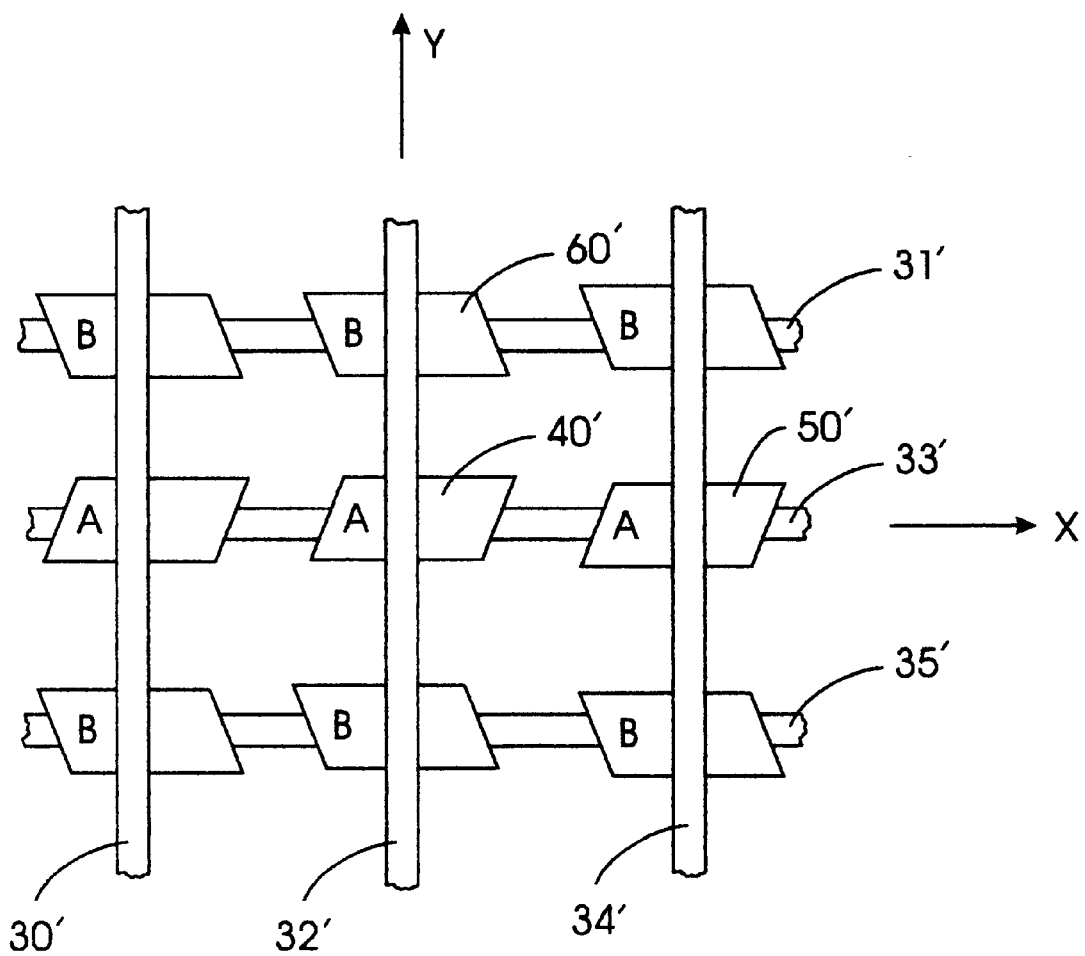
FIG. 8 depicts the MRAM array of the present invention illustrating an alternative embodiment of an alternating pattern of two types of parallelogram-shaped asymmetric cells, wherein cells of the same type are arranged in rows.

Referring to FIG. 8 another embodiment of the invention is a MRAM array wherein two different cells that are asymmetric in regards to the magnetization direction of a magnetic storage element in the cell (denoted A and B cells in FIG. 8) are formed on a substrate in an alternating line pattern. Cells of the same type are in rows that alternate along the Y-axis, which is the axis closest to the hard axis direction of the magnetic elements.

In a preferred array shown in FIG. 8, each of the cells has a parallelogram shape with a length and a width. Electrically conductive write lines 31', 33', 35' are parallel to the array X-axis and are located below a row of cells, and electrically conductive write lines 30', 32', 34' (also used as sense lines) are substantially parallel to the Y-axis and are located above a column of cells. Write circuitry is connected to the write lines and controlled as described above to write cells of type A and type B. A cell 40' selected for writing of type A is adjacent to a neighbor cell 60' of type B along the Y-axis. The neighbor cell 50' along the X-axis is a cell of type A.

Figure 9:
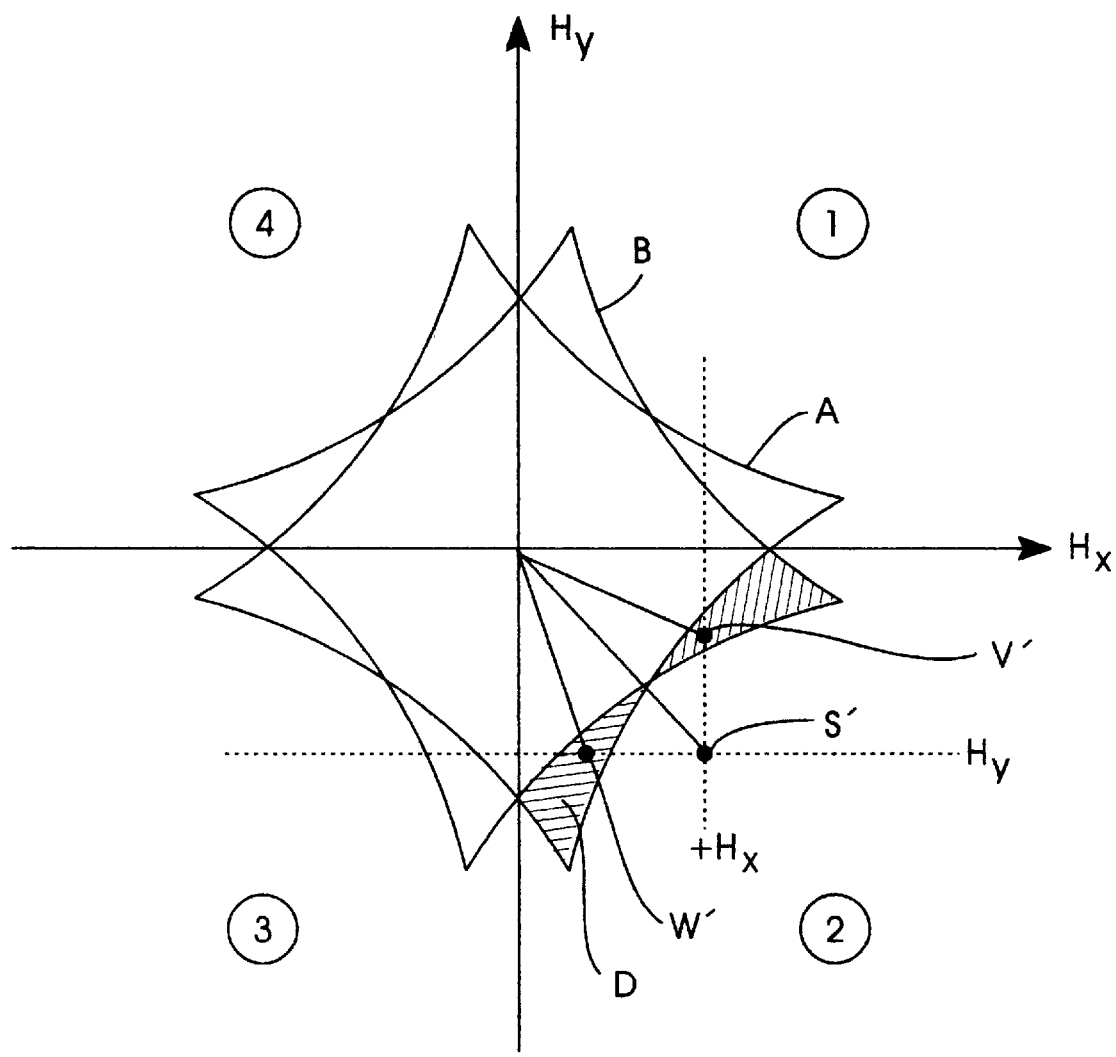
FIG. 9 shows asteroid models of the magnetic response of single magnetic tunnel junction cells, each cell having an unpredictable response, for A and B type cells in the MRAM array, illustrating the additional write margin provided by the regions where the asteroid curves overlap.

FIG. 9 is a copy of FIG. 6 with original points of the write field vectors replaced with points S', V', and W', which represent the magnetic fields for cells 40', 60' and 50', respectively. The selected cell 40' of type A is written because S' is outside curve A. The neighbor cell 60' of type B is not written because V' is inside curve B, and neighbor cell 50' of type A is not written because W' is inside curve A. The cross-hatched region in FIG. 9 indicates the extra write margin achieved by choosing the alternating line cell arrangement according to FIG. 8.

Figure 10:
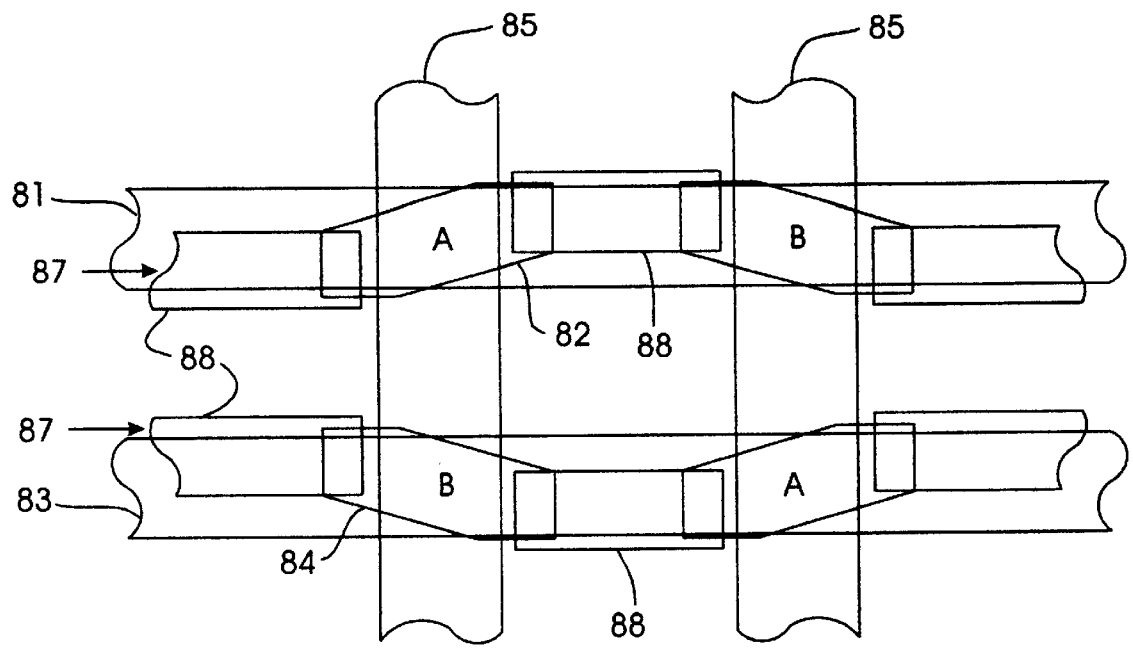
FIG. 10 depicts a top view of a GMR type of MRAM array according to the present invention having asymmetric magnetic memory cells arranged in a checkerboard pattern and disposed at the intersecting regions of crossing sense lines and word lines with their predominant axes of magnetization being canted or angled from the conductor lines.

Referring now to FIG. 10, another embodiment of the present invention with GMR magnetic elements is a pair of asymmetric GMR spin valve magnetic memory cells arranged in a checkerboard pattern, denoted as A and B cells in FIG. 10, each with a magnetic layer for storing data states with a predominant axis of magnetization, where the predominant axes of magnetization of the magnetic layer of the two cells are not parallel. GMR elements have at least one fixed magnetic layer and at least one free magnetic layer which is used to store data by its direction of magnetization, both in a sandwich structure with intervening thin copper layers. Preferably the predominant axis of one of the cells in the pair, e.g. A, is rotated counter clockwise from the direction of a conductor 81 which carries a write current and the predominant axis of the other cell of the pair, e.g. B, is rotated an equal amount clockwise from a conductor 83 which carries a write current for cell B. In FIG. 10 the pair of cells share a write conductor 85 which lies along the Y-axis of a presumed X-Y coordinate system. Preferably, the write conductor 85 is below the magnetic elements and the other write conductors 81, 83 are above the magnetic elements, rather than all the conductors being above the magnetic elements. In this way the average spacing of the conductors is minimized. Insulating layers between the magnetic elements and the conductors are as thin as practical to produce sufficient write fields with the smallest amount of current. Write circuitry is connected to the write lines to enable write currents to be directed in either direction along their lengths. In addition to the write conductors described above, a sense line connects a string of GMR cells in series. The sense lines 87 include the GMR spin valve elements, such as elements 82, 84, connected in series by low resistance metal stitch regions 88.

The rotation of magnetization direction is preferably created by a difference in shape between A and B cells. Various shapes will produce a rotation of magnetization direction away from the X or Y axes. Parallelograms, rectangles not aligned with the axis, trapezoids, truncated parallelograms and other shapes are possible. For ease of forming the overlap region between the stitch conductors 88 and the GMR elements in the A and B cells, and to provide for high packing density between the cells, a truncated parallelogram is preferred. The asteroids for cell A and B in FIG. 10 are similar to those shown in FIG. 7. The write margin for a pair of asymmetric cells A and B is the same as has been described above with respect to FIG. 7.

Figure 11:
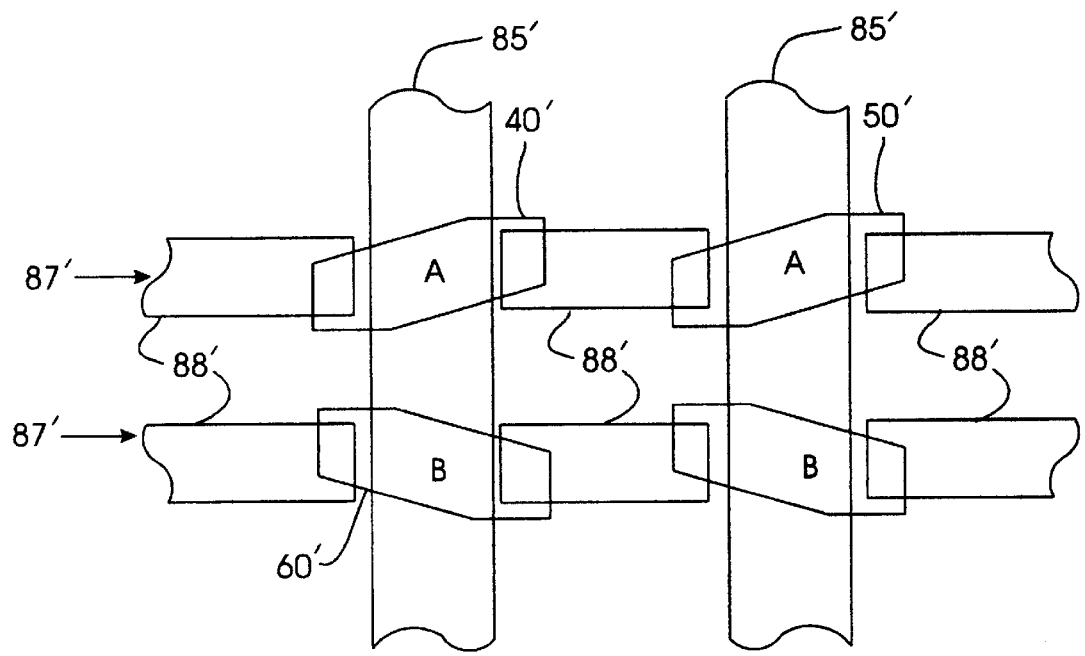
FIG. 11 depicts the GMR MRAM array of the present invention illustrating an alternative embodiment of an alternating pattern of two types of parallelogram- shaped cells, wherein cells of the same type are arranged in rows with the ends of the cells overlapping the widths of the conductor lines.

Referring now to FIG. 11, a GMR MRAM array uses two types of cells of an asymmetric pair (denoted A and B cells in FIG. 11) formed on a substrate in an alternating line pattern along the axis (Y-axis) that is closest to the hard axis of the cells. The arrangement uses an overlap region between the metal stitches 88' and the GMR elements that covers just a portion of the element width so that currents flowing through the sense line are predominantly parallel to the X-axis in spite of the asymmetric shape of the A and B type GMR elements. The stitch elements 88' all lie on the same line. The write current parallel to the X-axis is carried in the sense line 87'. The write current parallel to the Y-axis is carried in a conductor 85' insulated from the GMR elements. The write field vectors for selected cell 40' and neighbor cells 60' and 50' are respectively points S', V' and W' in FIG. 9 since the write conductor 87' that produced $H_Y$ is in close proximity to the GMR element and increased write margin is achieved as described with respect to FIG. 9. In the embodiment of FIG. 11 the write conductor 85' is preferably above the GMR elements so the GMR elements can be fabricated on a smooth surface.

Figure 12A:
FIGS. 12A–12E illustrate other embodiments of paired asymmetric cells usable in the MRAM array according to the present invention.
Figure 12B:

FIGS. 12A–12E illustrate other embodiments of paired asymmetric cells. FIG. 12A depicts trapezoidal shaped cells with the axis of rotation being the X-axis. FIG. 12B depicts trapezoidal shaped cells rotated about the Y-axis.

Figure 12C:
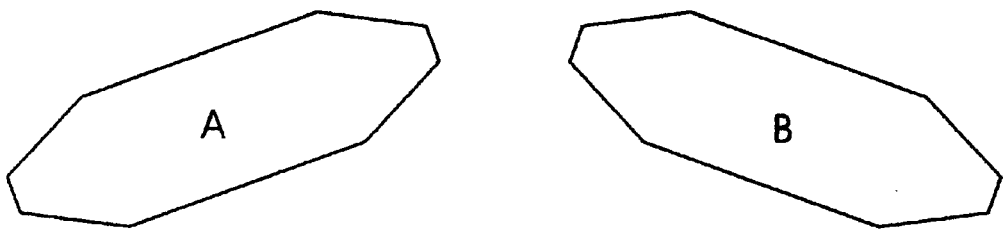
Figure 12D:
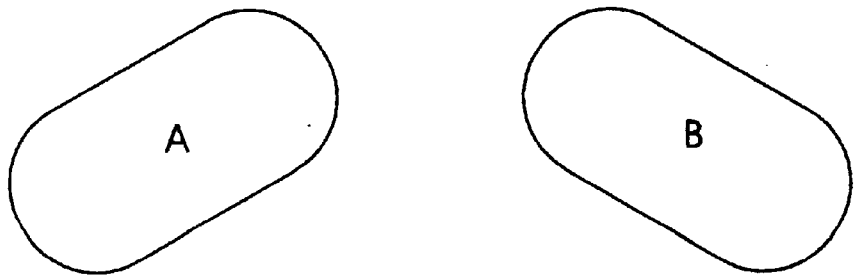

FIGS. 12C and 12D depict generally rectangularly shaped cells canted relative to the X and Y axes. Note that the generally rectangularly shaped cells of FIGS. 12C and 12D each has a geometrical axis of symmetry that generally coincides with the predominant axis of magnetization, but these cell shapes are still asymmetric because the geometric axis of symmetry and the predominant axis of magnetization is not parallel to either the X or Y axes. The generally rectangularly shaped cells in FIG. 12C have tapered ends along the long axis and the generally rectangularly shaped cells in FIG. 12D have rounded ends. These types of cells avoid the problem of multiple magnetic domains caused by abrupt changes at the ends of the cells, as described in U.S. Pat. Nos. 5,757,695 and 4,731,757.

Figure 12E:
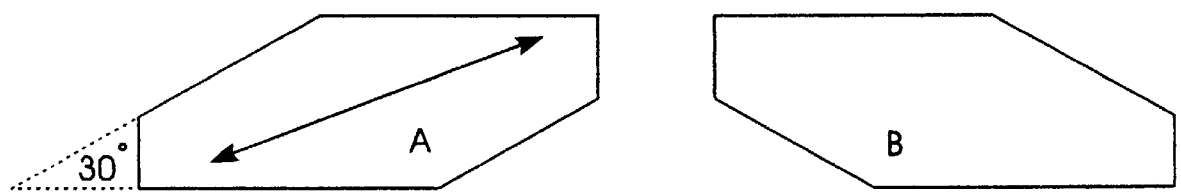

FIG. 12E shows a pair of cells having a truncated parallelogram shape, where the axis of rotation is the Y-axis Thus in the present invention, even though the drawings show pointed ends of the parallelogram and trapezoidal shaped cells, it is understood that such cells may have smoothly shaped corners at the apexes of the cells.

While in the present invention the preferred embodiment has the A and B cell types as mirror images of each other, this is not required so long as each of the cell types is asymmetric, i.e., the cell has a shape with a predominant axis of magnetization that is not parallel to either the X or Y axes. Thus it is possible in the present invention to select any one of the A cell types from FIGS. 12A–12E and any one of the B cell types of FIGS. 12A–12E in order to form an asymmetric pair.

While the invention has been particularly shown and described with reference to preferred embodiments thereof, it will be understood by those skilled in the art that various changes in form and details may be made therein without departing from the spirit and scope of the invention.

What is claimed is:

1. A nonvolatile magnetic memory array comprising:

a substrate;

a plurality of magnetic memory cells, each of the cells being one of two types of differently shaped cells, wherein the first type of cell has a shape that is the mirror image of the shape of the second type of cell, the two types of cells being formed on the substrate as an array of cells arranged in an alternating pattern;

a plurality of rows of electrically conductive lines formed on the substrate;

a plurality of columns of electrically conductive lines formed on the substrate, the rows and columns of lines intersecting near the memory cells.

2. The memory array according to claim 1 wherein the alternating pattern is a checkerboard pattern with all the nearest neighbor cells of a first type of cell being a second type of cell.

3. The memory array according to claim 1 wherein the alternating pattern has all first type of cells in alternating rows with all second type of cells in rows adjacent to the rows having the first type of cells.

4. The memory array according to claim 1 wherein the first type of cell is shaped generally as a non-parallelogram parallelogram.

5. The memory array according to claim 1 wherein the first type of cell is shaped generally as a truncated parallelogram.

6. The memory array according to claim 1 wherein the first type of cell is shaped generally as a rectangle and is arranged on the substrate with its length at a nonperpendicular angle to the rows and columns of lines.

7. The memory array according to claim 1 wherein the first type of cell is shaped generally as a trapezoid.

8. The memory array according to claim 1 wherein the cells have a length and a width and wherein the ends of the lengths of the cells are generally smoothly curved.

9. The memory array according to claim 1 wherein the memory cells are giant magnetoresistive memory cells.

10. The memory array according to claim 9 wherein the row s of electrically conductive lines include the giant magnetoresistive memory cells and conductive stitch regions that interconnect the giant magnetoresistive memory cells.

11. The memory array according to claim 9 further comprising electrically conductive sense lines interconnecting the giant magnetoresistive memory cells.

12. The memory array according to claim 1 wherein the memory cells are magnetic tunnel junction memory cells.

13. The memory array according to claim 12 wherein each of the magnetic tunnel junction memory cells comprises:

a fixed ferromagnetic layer having its magnetization oriented in a preferred direction and substantially prevented from rotation in the presence of an applied magnetic field caused by electrical current flowing through the lines;

a free ferromagnetic layer whose magnetization is free to rotate in the presence of an applied magnetic field caused by electrical current flowing simultaneously through both of the lines intersecting at the memory cell; and an insulating tunnel barrier layer located between the pinned and free ferromagnetic layers.

14. A nonvolatile magnetic memory array of magnetic tunnel junction (MTJ) memory cells comprising:

a substrate;

a first set of parallel electrically conductive lines formed on the substrate;

a second set of parallel electrically conductive lines formed on the substrate generally perpendicular to the first set of lines and overlapping the first set of lines, the second set of lines being spaced from the first set of lines in a direction generally perpendicular to the substrate surface to define a plurality of intersection regions;

a plurality of magnetic tunnel junction cells, each of the cells being one of two types of differently shaped cells, wherein the first type of cell has a shape that is identical to the shape of the second type of cell when one of the types of cells is rotated 180 degrees about an axis generally parallel to one of the lines, each of the cells being formed at an intersection region on the substrate and the two types of cells being arranged on the substrate in a checkerboard pattern.

15. The memory array according to claim 14 wherein the first type of cell is shaped generally as a parallelogram non-rectangular.

16. The memory array according to claim 14 wherein the first type of cell is shaped generally as a truncated parallelogram.

17. The memory array according to claim 14 wherein the first type of cell is shaped generally as a rectangle and is arranged on the substrate with its length at a nonperpendicular angle to the rows and columns of lines.

18. The memory array according to claim 14 wherein the first type of cell is shaped generally as a trapezoid.

19. The memory array according to claim 14 wherein the cells have a length and a width and wherein the ends of the lengths of the cells are generally smoothly curved.

20. A nonvolatile magnetic memory array comprising:

a substrate;

an array of two types of magnetic memory cells formed on the substrate in an alternating pattern;

a plurality of generally parallel rows of electrically conductive lines formed on the substrate;

a plurality of generally parallel columns of electrically conductive lines formed on the substrate, the columns of lines being arranged generally perpendicular to the rows of lines and the rows and columns of lines intersecting near the memory cells; and wherein all the cells of the first type have a predominant axis of magnetization that is oriented to form a counterclockwise acute angle with respect to the rows of lines, and all the cells of the second type have a predominant axis of magnetization that is oriented to form a clockwise acute angle with respect to the rows of lines.

21. The memory array according to claim 20 wherein the first type of cell has a shape that is different from the shape of the second type of cell.

22. The memory array according to claim 20 wherein the first type of cell has a shape that is the mirror image of the shape of the second type of cell.

23. The memory array according to claim 22 wherein each of the first and second types of cells has a geometric axis of symmetry that generally coincides with the predominant axis of magnetization.

24. The memory array according to claim 20 wherein the alternating pattern is a checkerboard pattern with all the nearest neighbor cells of a first type of cell being a second type of cell.

25. The memory array according to claim 20 wherein the alternating pattern has all first type of cells in alternating rows with all second type of cells in rows adjacent to the rows having the first type of cells.

26. The memory array according to claim 20 wherein the first type of cell is shaped generally as a parallelogram.

27. The memory array according to claim 20 wherein the first type of cell is shaped generally as a truncated parallelogram.

28. The memory array according to claim 20 wherein the first type of cell is shaped generally as a rectangle and is arranged on the substrate with its length at a nonperpendicular angle to the rows and columns of lines.

29. The memory array according to claim 20 wherein the first type of cell is shaped generally as a trapezoid.

30. The memory array according to claim 20 wherein the cells have a length and a width and wherein the ends of the lengths of the cells are generally smoothly curved.

31. The memory array according to claim 20 wherein the memory cells are giant magnetoresistive memory cells.

32. The memory array according to claim 31 wherein the rows of electrically conductive lines include the giant magnetoresistive memory cells and conductive stitch regions that interconnect the giant magnetoresistive memory cells.

33. The memory array according to claim 31 further comprising electrically conductive sense lines interconnecting the giant magnetoresistive memory cells.

34. The memory array according to claim 33 wherein the memory cells are magnetic tunnel junction memory cells.

* * * * *